(12) United States Patent
Ito et al.

(10) Patent No.: US 10,636,726 B2
(45) Date of Patent: Apr. 28, 2020

(54) SEMICONDUCTOR DEVICE, MANUFACTURING METHOD FOR SEMICONDUCTOR DEVICE, ELECTRONIC COMPONENT, CIRCUIT SUBSTRATE, AND ELECTRONIC APPARATUS

(71) Applicant: Advanced Interconnect Systems Limited, Dublin (IE)

(72) Inventors: Haruki Ito, Chino (JP); Nobuaki Hashimoto, Suwa (JP)

(73) Assignee: Advanced Interconnect Systems Limited, Dublin (IE)

( * ) Notice: Subject to any disclaimer, the term of this patent is extended or adjusted under 35 U.S.C. 154(b) by 0 days.

(21) Appl. No.: 16/569,596

(22) Filed: Sep. 12, 2019

(65) Prior Publication Data

US 2020/0006200 A1    Jan. 2, 2020

Related U.S. Application Data

(60) Continuation of application No. 16/435,143, filed on Jun. 7, 2019, now Pat. No. 10,424,533, which is a (Continued)

(30) Foreign Application Priority Data

Jun. 8, 2005 (JP) ................... 2005-168373

(51) Int. Cl.
*H01L 23/48* (2006.01)
*H03H 9/05* (2006.01)
(Continued)

(52) U.S. Cl.
CPC ........ *H01L 23/481* (2013.01); *H01L 23/4824* (2013.01); *H01L 23/50* (2013.01);
(Continued)

(58) Field of Classification Search
CPC ....... H01L 2924/00014; H01L 2924/00; H01L 2924/01074; H03H 9/0552
(Continued)

(56) References Cited

U.S. PATENT DOCUMENTS

| 4,221,047 A | 9/1980 | Narken et al. |
| 4,322,778 A | 3/1982 | Barbour et al. |

(Continued)

FOREIGN PATENT DOCUMENTS

| CN | 1750394 A | 3/2006 |
| EP | 1143614 A1 | 10/2001 |

(Continued)

*Primary Examiner* — Jonathan Han
(74) *Attorney, Agent, or Firm* — Kunzler Bean & Adamson

(57) ABSTRACT

A semiconductor device includes an integrated circuit that is disposed at a first face side of a semiconductor substrate, the semiconductor substrate having a first face and a second face, the second face opposing the first face, the semiconductor substrate having a through hole from the first face to the second face; an external connection terminal that is disposed at the first face side; a conductive portion that is disposed in the through hole, the conductive portion being electrically connected to the external connection terminal; and an electronic element that is disposed at a second face side.

30 Claims, 11 Drawing Sheets

Related U.S. Application Data continuation of application No. 16/016,329, filed on Jun. 22, 2018, now Pat. No. 10,361,144, which is a continuation of application No. 14/521,614, filed on Oct. 23, 2014, now abandoned, which is a continuation of application No. 14/156,806, filed on Jan. 16, 2014, now Pat. No. 8,896,104, which is a division of application No. 13/624,324, filed on Sep. 21, 2012, now Pat. No. 8,673,767, which is a continuation of application No. 13/185,039, filed on Jul. 18, 2011, now Pat. No. 8,294,260, which is a continuation of application No. 12/237,750, filed on Sep. 25, 2008, now Pat. No. 8,012,864, which is a division of application No. 11/433,901, filed on May 12, 2006, now Pat. No. 7,495,331.

(51) Int. Cl.
*H01L 23/00* (2006.01)
*H03H 9/10* (2006.01)
*H01L 23/50* (2006.01)
*H01L 23/522* (2006.01)
*H01L 23/482* (2006.01)

(52) U.S. Cl.
CPC ......... *H01L 23/522* (2013.01); *H03H 9/0547* (2013.01); *H03H 9/0552* (2013.01); *H03H 9/1071* (2013.01); *H01L 24/12* (2013.01); *H01L 2224/05009* (2013.01); *H01L 2224/05022* (2013.01); *H01L 2224/05025* (2013.01); *H01L 2224/05027* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05184* (2013.01); *H01L 2224/05186* (2013.01); *H01L 2224/05548* (2013.01); *H01L 2224/05624* (2013.01); *H01L 2224/05644* (2013.01); *H01L 2224/05647* (2013.01); *H01L 2224/05686* (2013.01); *H01L 2224/16* (2013.01); *H01L 2924/01019* (2013.01); *H01L 2924/01046* (2013.01); *H01L 2924/01078* (2013.01); *H01L 2924/01079* (2013.01); *H01L 2924/04941* (2013.01); *H01L 2924/14* (2013.01)

(58) Field of Classification Search
USPC .......... 257/774, E25.013, E21.502, E21.597, 257/E23.178, E25.023, 678; 438/108–109
See application file for complete search history.

(56) References Cited

U.S. PATENT DOCUMENTS

| | | | |
|---|---|---|---|
| 4,837,176 A | 6/1989 | Zdebel et al. | |
| 5,028,983 A | 7/1991 | Bickford et al. | |
| 5,108,541 A | 4/1992 | Schneider et al. | |
| 6,222,276 B1 | 4/2001 | Bertin et al. | |
| 6,239,495 B1 | 5/2001 | Sakui et al. | |
| 6,362,529 B1 | 3/2002 | Sumikawa et al. | |
| 6,400,008 B1 | 6/2002 | Farnworth | |
| 6,545,366 B2 | 4/2003 | Michii et al. | |
| 6,608,377 B2 | 8/2003 | Chang et al. | |
| 6,661,077 B2 | 12/2003 | Mashino | |
| 6,696,320 B2 | 2/2004 | Gacusan | |
| 6,707,153 B2 | 3/2004 | Kuwabara et al. | |
| 6,720,661 B2 | 4/2004 | Hanaoka et al. | |
| 6,809,421 B1 | 10/2004 | Hayasaka et al. | |
| 6,831,367 B2 | 12/2004 | Sekine | |
| 6,864,172 B2 | 3/2005 | Noma et al. | |
| 6,873,035 B2 | 3/2005 | Watanabe et al. | |
| 6,905,946 B2 | 6/2005 | Grigg et al. | |
| 6,962,865 B2 | 11/2005 | Hanaoka et al. | |
| 7,102,219 B2 | 9/2006 | Hanaoka et al. | |
| 7,176,599 B2 | 2/2007 | Kawachi et al. | |
| 7,215,033 B2 | 5/2007 | Lee et al. | |
| 7,233,065 B2 | 6/2007 | Watanabe et al. | |
| 7,355,273 B2 | 4/2008 | Jackson et al. | |
| 7,495,331 B2 | 2/2009 | Ito et al. | |
| 8,294,260 B2 | 10/2012 | Ito et al. | |
| 8,324,711 B2 | 12/2012 | Goldberger et al. | |
| 2001/0006829 A1 | 7/2001 | Moden et al. | |
| 2001/0033120 A1 | 10/2001 | Kobayashi et al. | |
| 2002/0020898 A1* | 2/2002 | Vu | H01L 21/56 257/676 |
| 2002/0030245 A1 | 3/2002 | Hanaoka et al. | |
| 2004/0135645 A1* | 7/2004 | Koyama | H03H 9/0547 331/158 |
| 2004/0178502 A1 | 9/2004 | Ishikawa et al. | |
| 2004/0227258 A1* | 11/2004 | Nakatani | H01L 23/49805 257/787 |
| 2005/0023664 A1* | 2/2005 | Chudzik | H01L 23/50 257/678 |
| 2005/0063635 A1 | 3/2005 | Yamada et al. | |
| 2006/0012967 A1* | 1/2006 | Asai | G02B 6/43 361/764 |
| 2007/0023895 A1 | 2/2007 | Watanabe et al. | |
| 2007/0107177 A1 | 5/2007 | Kawachi et al. | |
| 2007/0205505 A1 | 9/2007 | Watanabe et al. | |
| 2010/0065858 A1 | 3/2010 | Sugiura | |

FOREIGN PATENT DOCUMENTS

| | | |
|---|---|---|
| EP | 1635457 A2 | 3/2006 |
| JP | 10321762 A | 12/1998 |
| JP | 2000311982 A | 7/2000 |
| JP | 200194390 A | 4/2001 |
| JP | 2002152000 A | 5/2002 |
| JP | 2002184933 A | 6/2002 |
| JP | 2002208655 A | 7/2002 |
| JP | 2002252310 A | 9/2002 |
| JP | 2002290184 A | 10/2002 |
| JP | 2002290200 A | 10/2002 |
| JP | 2002359523 A | 12/2002 |
| JP | 2003017941 A | 1/2003 |
| JP | 2003273106 A | 9/2003 |
| JP | 2003282790 A | 10/2003 |
| JP | 2003309296 A | 10/2003 |
| JP | 204214787 A | 7/2004 |
| JP | 2004235719 A | 8/2004 |
| JP | 2004364041 A | 12/2004 |
| JP | 2005072419 A | 3/2005 |
| JP | 2005101128 A | 4/2005 |
| WO | 01071805 A1 | 9/2001 |
| WO | 2005038905 A1 | 4/2005 |

\* cited by examiner

SEMICONDUCTOR DEVICE, MANUFACTURING METHOD FOR SEMICONDUCTOR DEVICE, ELECTRONIC COMPONENT, CIRCUIT SUBSTRATE, AND ELECTRONIC APPARATUS

CROSS-REFERENCE TO RELATED APPLICATION

This application is a continuation patent application of U.S. Ser. No. 16/435,143 filed Jun. 7, 2019, which is a continuation patent application of U.S. Ser. No. 16/016,329 filed Jun. 22, 2018, now U.S. Pat. No. 10,361,144 issued Jul. 23, 2019, which is a continuation patent application of U.S. Ser. No. 14/521,614 filed Oct. 23, 2014, which is a continuation patent application of U.S. Ser. No. 14/156,806 filed Jan. 16, 2014, now U.S. Pat. No. 8,896,104 issued Nov. 25, 2014, which is a divisional application of U.S. Ser. No. 13/624,324 filed Sep. 21, 2012, now U.S. Pat. No. 8,673,767 issued Mar. 18, 2014, which is a continuation application of U.S. Ser. No. 13/185,039 filed Jul. 18, 2011, now U.S. Pat. No. 8,294,260 issued Oct. 23, 2012, which is a continuation application of U.S. Ser. No. 12/237,750 filed Sep. 25, 2008, now U.S. Pat. No. 8,012,864 issued on Sep. 6, 2011, which is a divisional application of U.S. Ser. No. 11/433,901 filed May 12, 2006, now U.S. Pat. No. 7,495,331 issued on Feb. 24, 2009, which claims priority to Japanese Patent Application No. 2005-168373, filed Jun. 8, 2005, all of which are incorporated herein by reference in their entireties.

BACKGROUND

1. Technical Field

The present invention relates to a semiconductor device, a manufacturing method for a semiconductor device, an electronic component, a circuit substrate, and an electronic apparatus.

2. Related Art

Recently, electronic components including surface acoustic wave elements (hereinafter abbreviated as 'SAW element') as, for example, resonators and band filters are used in electronic apparatuses such as mobile telephones and television receivers.

Japanese Unexamined Patent Application, First Publication No. 2002-290184 and Japanese Unexamined Patent Application, First Publication No. 2002-290200 disclose examples of techniques relating to electronic components including SAW elements.

Japanese Unexamined Patent Application, First Publication No. 2002-290184 discloses a technique relating to an electronic component package in which a SAW element and an integrated circuit driving and controlling the SAW element are arranged in the same space.

Japanese Unexamined Patent Application, First Publication No. 2002-290200 discloses a technique relating to an electronic component package in which a SAW element is packaged on a first substrate and an integrated circuit is packaged on a second substrate.

Requests to miniaturize electronic apparatuses in which electronic components including SAW elements are packaged are being accompanied by requests to miniaturize electronic components including semiconductor devices and electronic apparatuses, on which electronic elements such as SAW elements are packaged.

However, the configuration disclosed in Japanese Unexamined Patent Application, First Publication No. 2002-290184 is difficult to miniaturize, since the SAW element and the integrated circuit are arranged in parallel.

Similarly, the configuration disclosed in Japanese Unexamined Patent Application, First Publication No. 2002-290200 is difficult to make thin (small), since the first substrate on which the SAW element is packaged, and the second substrate on which the integrated circuit is packaged, are superimposed.

In addition to electronic components including SAW elements, there are also demands for smaller electronic components including electronic elements which require airtight sealing, such as crystal oscillators, and piezoelectric oscillators, and piezoelectric tuning-forks.

SUMMARY

An advantage of some aspects of the invention is to provide a semiconductor device, a manufacturing method for a semiconductor device, an electronic component, a circuit substrate, and an electronic apparatus, which can be made smaller, thinner, and achieve higher performance.

A first aspect of the invention provides a semiconductor device includes: a semiconductor substrate including a first face and a second face on a side opposite to the first face; an external connection terminal formed on the first face of the semiconductor substrate; a first electrode formed on the first face of the semiconductor substrate and electrically connected to the external connection terminal; an electronic element formed on or above the second face of the semiconductor substrate; a second electrode electrically connected to the electronic element and having a top face and a rear face; a groove portion formed on the second face of the semiconductor substrate and having a bottom face including at least part of the rear face of the second electrode; and a conductive portion formed in the groove portion and electrically connected to the rear face of the second electrode.

According to the semiconductor device of the first aspect of the invention, since the conductive portion is formed in the groove portion having a bottom face including at least part of the rear face of the second electrode, the second electrode and the electronic element can be electrically connected via the conductive portion.

Furthermore, since the first electrode is electrically connected to the external connection terminal, the overall semiconductor device which can be connected to an external apparatus (e.g., a circuit substrate) and the similar, can be made smaller and thinner, and its performance can be increased.

It is preferable that the semiconductor device of the first aspect of the invention further include: an interconnection formed on the first face of the semiconductor substrate and electrically connected to the first electrode and the external connection terminal; and a stress-absorbing layer formed between the semiconductor substrate and the external connection terminal.

According to the semiconductor device of the first aspect of the invention, since the semiconductor device is provided with the interconnection by connecting the first electrode to the external connection terminal via the interconnection, the shape and arrangement of the external connection terminal can be set more freely.

In addition, the stress-absorbing layer increases the reliability of the connection between the semiconductor device and external apparatuses and the similar.

It is preferable that the semiconductor device of the first aspect of the invention further include: a metal film formed on the top face of the second electrode and including an identical material of the interconnection.

In the semiconductor device of the first aspect of the invention, a material which is highly resistant to corrosion is generally used for the interconnection.

Therefore, by forming the metal film from the identical material of the interconnection on the top face of the second electrode, corrosion of the top face of the second electrode can be prevented, and the generation of electrical malfunctions can be prevented.

It is preferable that the semiconductor device of the first aspect of the invention further include: a connection electrode formed on the second face of the semiconductor substrate and electrically connected to the conductive portion.

In the semiconductor device according to the first aspect of the invention, by providing the connection electrode electrically connected to the conductive portion (e.g., by forming a connection electrode corresponding to the electrode shape of the electronic element), the degree of freedom when designing the connection structure of the electronic element can be increased.

A second aspect of the invention provides manufacturing method for a semiconductor device includes: preparing a semiconductor substrate including a first face and a second face on a side opposite to the first face; forming a first electrode on the first face of the semiconductor substrate; forming a second electrode having a top face and a rear face on the first face of the semiconductor substrate; forming on the first face of the semiconductor substrate an interconnection electrically connected to the first electrode; electrically connecting the first electrode to the interconnection by forming an external connection terminal connected to the interconnection on the first face of the semiconductor substrate; forming a stress-absorbing layer between the semiconductor substrate and the external connection terminal; forming a groove portion having a bottom face including at least part of the rear face of the second electrode, on the second face of the semiconductor substrate; forming an insulating film on side wall of the groove portion; and forming in the groove portion a conductive portion electrically connecting an electronic element to the second electrode.

According to the manufacturing method for semiconductor device of the second aspect of the invention, since the groove portion is formed from the second face of the semiconductor substrate on which the second electrode is not formed, it becomes easier to form the conductive portion for electrically connecting to the second electrode.

Since the conductive portion for electrically connecting to the second electrode is formed after forming the insulating film on the side walls of the grooves section, the conductive portion and the semiconductor substrate can be reliably insulated.

This enables a voltage to be applied accurately from the second electrode to the electronic element via the conductive portion, whereby the electronic element can be driven reliably.

It is preferable that, in the manufacturing method for the semiconductor device of the second aspect of the invention, photolithography and etching be used in the forming of the groove portion.

According to the manufacturing method for semiconductor device of the second aspect of the invention, by using photolithography and etching, the groove portion can be precisely formed in the semiconductor substrate.

It is preferable that the manufacturing method for the semiconductor device of the second aspect of the invention further include: forming a connection electrode electrically connected to the conductive portion, on the second face of the semiconductor substrate, and connection electrode and the conductive portion be formed in one operation.

In the manufacturing method for semiconductor device according to the second aspect of the invention, by forming the connection electrode and the conductive portion in one operation, the semiconductor device can be manufactured efficiently and the manufacturing cost can be reduced.

It is preferable that the manufacturing method for the semiconductor device of the second aspect of the invention further include: forming a plurality of semiconductor devices on the semiconductor substrate in one operation; dividing each of the semiconductor devices by cutting the semiconductor substrate; and obtaining a plurality of individual semiconductor devices.

According to the manufacturing method for semiconductor device of the second aspect of the invention, a plurality of semiconductor devices are formed simultaneously on the substrate and the substrate is then cut into individual semiconductor devices, it is possible to reduce the manufacturing cost of the semiconductor device.

A third aspect of the invention provides a electronic component includes: a semiconductor substrate including a first face and a second face on a side opposite to the first face; an external connection terminal formed on the first face of the semiconductor substrate; a first electrode formed on the first face of the semiconductor substrate and electrically connected to the external connection terminal; an electronic element formed on or above the second face of the semiconductor substrate; a second electrode electrically connected to the electronic element and having a top face and a rear face; a groove portion formed on the second face of the semiconductor substrate and having a bottom face including at least part of the rear face of the second electrode; a conductive portion formed in the groove portion and electrically connected to the rear face of the second electrode; and a sealing member sealing the electronic element.

According to the electronic component of the third aspect of the invention, by forming the electronic element on the second face of the semiconductor substrate and electrically connecting the electronic element to the conductive portion, the second electrode can be electrically connected to the electronic element via the conductive portion.

Furthermore, since the first electrode is electrically connected to the external connection terminal, the overall electronic component which can be connected to external apparatuses and the similar can be made smaller and thinner.

Moreover, since the electronic element is sealed by the sealing member, the overall electronic component can be made smaller and thinner while enabling the electronic element to be driven reliably.

It is preferable that, in the electronic component of the third aspect of the invention, the sealing member be spaced from the second face of the semiconductor substrate, and include a facing face facing the second face of the semiconductor substrate, and the electronic element is formed on the facing face.

According to the electronic component of the third aspect of the invention, since the electronic element is formed on a facing face of the sealing member, the electronic element can be sealed by electrically connecting the electronic element to the conductive portion.

Therefore, a sealed electronic component can be obtained with a simple configuration.

It is preferable that the electronic component of the third aspect of the invention further include: a supporting substrate supporting the electronic element, and the sealing member spaced from the second face of the semiconductor substrate, and the supporting substrate be arranged between the sealing member and the semiconductor substrate.

According to the electronic component of the third aspect of the invention, since the electronic element is formed on the supporting substrate, it is possible to electrically connect the electronic element and the conductive portion, while the supporting substrate supports the electronic element.

This enables the electronic element to be driven reliably.

It is preferable that the electronic component of the third aspect of the invention further include: a supporting substrate spaced from the second face of the semiconductor substrate and supporting the electronic element, and the sealing member seals the electronic element supported by the supporting substrate and include an electronic element electrode electrically connected to the electronic element.

According to the electronic component of the third aspect of the invention, since the electronic element supported by the supporting substrate is sealed by the sealing member, the electronic element can be made smaller and thinner, and driven reliably, by connecting the electronic element electrode formed on the sealing member to the conductive portion.

It is preferable that the electronic component of the third aspect of the invention further include: a connection electrode formed on the second face of the semiconductor substrate and electrically connecting the conductive portion to the electronic element.

According to the electronic component of the third aspect of the invention, by forming a connection electrode which, for example, corresponds to the electrode shape of the electronic element, a reliably state of conduction can be obtained between the electronic element and the second electrode.

A fourth aspect of the invention provides a circuit substrate on which the above described electronic component is packaged.

According to the circuit substrate of the fourth aspect of the invention, it is possible to provide a circuit substrate on which a small and thin electronic component is packaged (e.g., a printed wiring board).

Therefore, even if this circuit substrate is packaged in an electronic apparatus or the similar, an increase in the size of the electronic apparatus can be prevented.

A fifth aspect of the invention provides an electronic apparatus in which the above described electronic component is packaged.

According to the electronic apparatus of the fifth aspect of the invention, it is possible to provide an electronic apparatus in which a small and thin electronic component is packaged.

This enables the electronic apparatus to be made smaller.

DESCRIPTION OF EXEMPLARY EMBODIMENTS

Embodiment of Semiconductor Device

Subsequently, an embodiment of a semiconductor device of this invention will be explained with reference to FIGS. 1 to 6.

Figure 1:
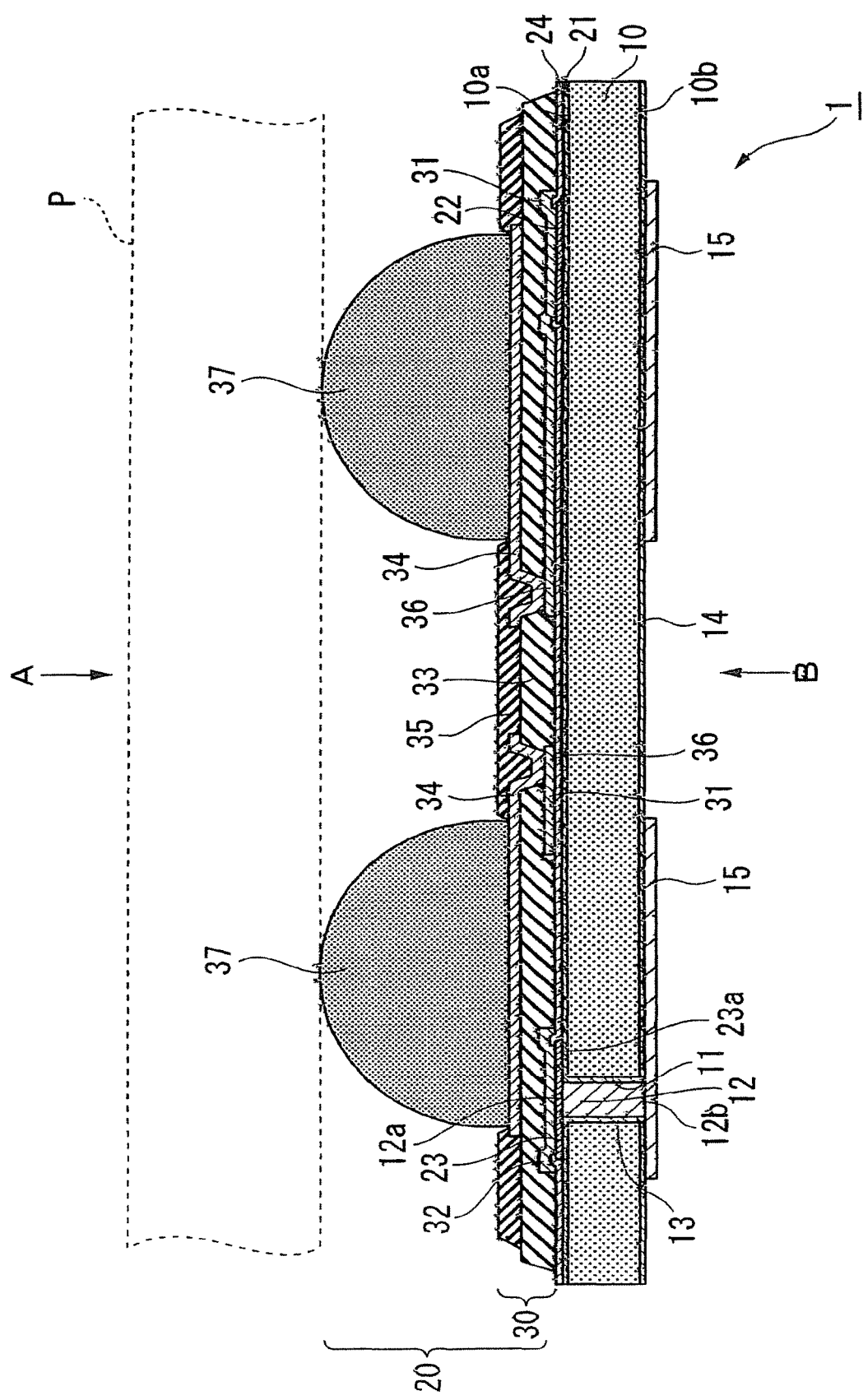
FIG. 1 is a cross-sectional view of a semiconductor device according to an embodiment of this invention.

As shown in FIG. 1, a semiconductor device 1 according to this embodiment includes a silicon substrate 10 (semiconductor substrate) and a connector 20.

The connector 20 is formed on a first face 10a of the silicon substrate 10, and electrically connects a printed wiring board P (circuit substrate) to electrodes and interconnections formed on the first face 10a. The printed wiring board P is an external apparatus.

As shown in FIG. 1, a groove portion 11 is formed in a second face 10b which is on a side opposite to the first face 10a of the silicon substrate 10.

A bottom face of the groove portion 11 includes a rear face of a second electrode 23.

A conductive portion 12 is formed by filling the inside of groove portion 11 with a conductive material.

An insulating film 13 is formed on side walls of the groove portion 11, and electrically insulates the conductive portion 12 from the silicon substrate 10.

A rear face insulating layer 14 is formed on a top face of the second face 10b of the silicon substrate 10 in regions other than a region on which the groove portion 11 is formed.

Figure 3:
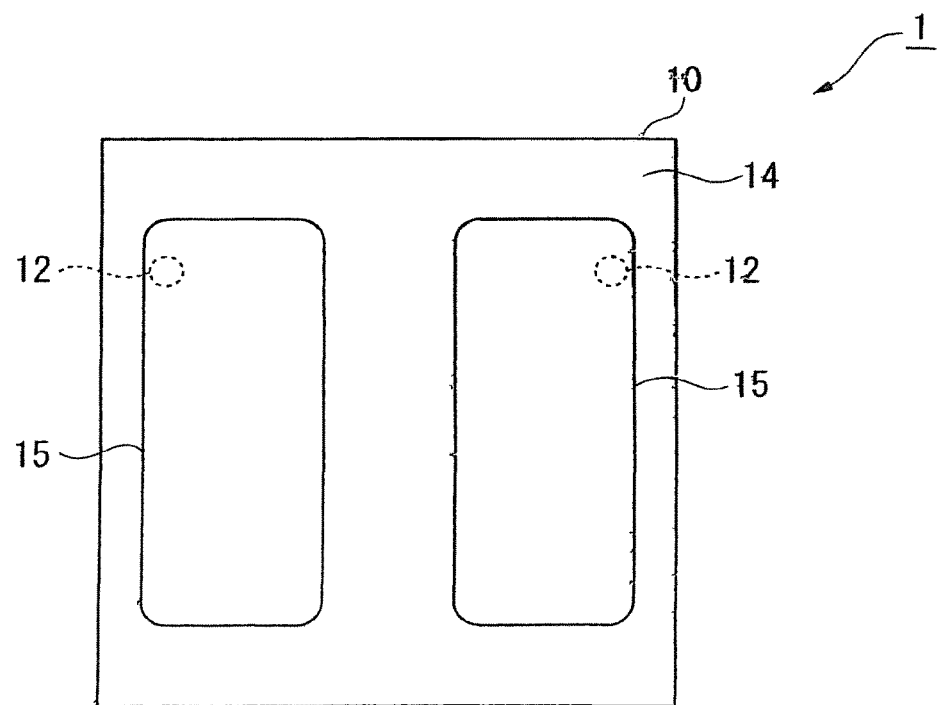
FIG. 3 is a plan view from the arrow B of the semiconductor device of FIG. 1.

As shown in FIG. 3, rear face electrodes 15 (connection electrode) are formed on the rear face insulating layer 14, and corresponds to electrodes of electronic elements, for example, surface acoustic wave (SAW) elements.

The connector 20 includes a foundation layer 21 formed on the first face 10a of the silicon substrate 10, a first electrode 22 and a second electrode 23 which are respectively formed in a plurality of predetermined regions of the foundation layer 21, a first insulating layer 24, and an interconnection section 30 formed on the first insulating layer 24.

The foundation layer 21 is formed from an insulative material such as silicon dioxide ($SiO_2$) and silicon nitride ($Si_3N_4$).

As materials of the first electrode 22 and the second electrode 23, titanium (Ti), titanium nitride (TiN), aluminum (Al), copper (Cu), or an alloy of these can be used.

The first insulating layer 24 is formed on the silicon substrate 10, excepting the regions on which the first electrode 22 and the second electrode 23 are formed.

Figure 2:
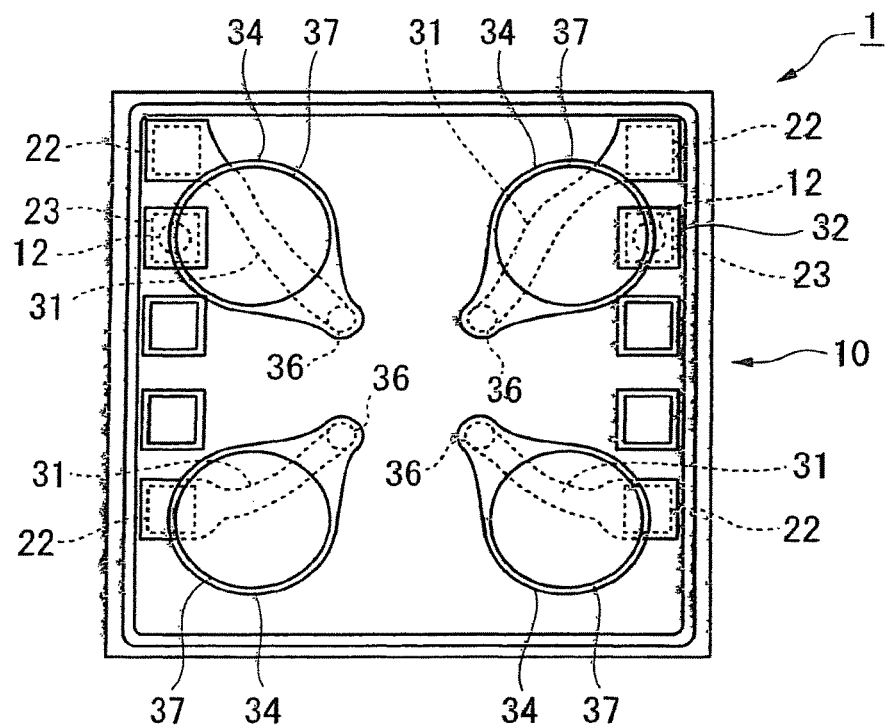
FIG. 2 is a plan view from the arrow A of the semiconductor device of FIG. 1.

While a plurality of electrodes may be formed in the silicon substrate 10 as shown in FIG. 2, only with respect to the first electrode 22 and the second electrode 23 are explained in this embodiment.

The second electrode 23 may be covered by the first insulating layer 24.

An integrated circuit having a transistor and a memory element for example, is formed under the foundation layer 21.

This integrated circuit is electrically connected to the first electrode 22 and the second electrode 23.

As shown in FIGS. 1 and 2, the interconnection section 30 includes a first interconnection 31 (interconnection), a metal film 32, a second insulating layer 33 (stress-absorbing layer), a second interconnection 34 (interconnection), and a third insulating layer 35.

The first interconnection 31 (interconnection) is electrically connected to the first electrode 22 formed on the first insulating layer 24.

The metal film 32 is formed on the top face of the second electrode 23.

The second insulating layer 33 (stress-absorbing layer) is formed over the first interconnection (interconnection) 31 and the metal film 32.

The second interconnection (interconnection) 34 is formed on the second insulating layer 33 and electrically connected to the first interconnection 31.

The third insulating layer 35 is formed on the second interconnection 34.

A part of the first interconnection 31 is exposed from the second insulating layer 33 to form a land section 36.

The land section 36 and the second interconnection 34 are electrically connected.

Moreover, a bump (external connection terminal) 37 is formed on the second interconnection 34, and the semiconductor device 1 is electrically connected via this bump 37 to the printed wiring board P.

The third insulating layer 35 is formed on the second insulating layer 33 and the second interconnection 34, excepting the region on which the bump 37 is formed.

The first electrode 22 is electrically connected to the bump 37 via the first interconnection 31 and the second interconnection 34.

The second electrode 23 is formed on the foundation layer 21 formed on the first face 10a of the silicon substrate 10.

A part of the rear face of the second electrode 23 forms the bottom face of the groove portion 11.

Consequently, a rear face 23a of the second electrode 23 and a first end 12a of the conductive portion 12 are electrically connected inside the groove portion 11.

A second end 12b of the conductive portion 12 is electrically connected to the rear face electrode 15 formed in the second face 10b of the silicon substrate 10.

That is, the second electrode 23 is electrically connected to an electronic element formed in the second face 10b of the silicon substrate 10.

As examples of materials of the first interconnection 31 and the second interconnection 34, gold (Au), copper (Cu), titanium (Ti), tungsten (W), titanium-tungsten (TiW), titanium nitride (TiN), nickel (Ni), nickel vanadium (NiV), chrome (Cr), aluminum (Al), and palladium (Pd) can be used.

The structures of the first interconnection 31 and the second interconnection 34 may be single-layer structures of the above materials or laminated structures combining multiple layers.

The first insulating layer 24, the second insulating layer 33, and the third insulating layer 35 are formed from resin (synthetic resin).

Examples of materials for forming the first insulating layer 24, the second insulating layer 33, and the third insulating layer 35 can be used polyimide resin, silicon-modified polyimide resin, epoxy resin, silicon-modified epoxy resin, acrylic resin, phenol resin, benzocyclobutene (BCB), polybenzoxazole (PCB), or any material with insulating properties.

The first insulating layer 24 may be formed from an insulating material such as silicon dioxide ($SiO_2$) and silicon nitride ($Si_3N_4$).

It is preferable that the material of the metal film 32 be the same as that of the first interconnection 31 and the second interconnection 34.

A metal such as Au, TiW, Cu, Cr, Ni, Ti, W, NiV, and Al can be used as the material for the metal film 32.

The metal film 32 may be laminated from these metals.

It is preferable that the metal film 32 (at least one layer in the case of a laminated structure) be formed from a material with higher resistance to corrosion than the electrode, such as Au, TiW, and Cr.

This prevents corrosion of the electrode and prevents generation of electrical malfunctions.

Manufacturing Method for Semiconductor Device

Subsequently, a manufacturing method for the semiconductor device 1 will be explained while referring to FIGS. 4A to 5C.

In this embodiment, a plurality of the semiconductor devices 1 are formed simultaneously in one operation on a single silicon substrate 100 (semiconductor substrate).

Each of the FIGS. 4A to 5C below describes the formation of one semiconductor device 1.

Figure 4A:
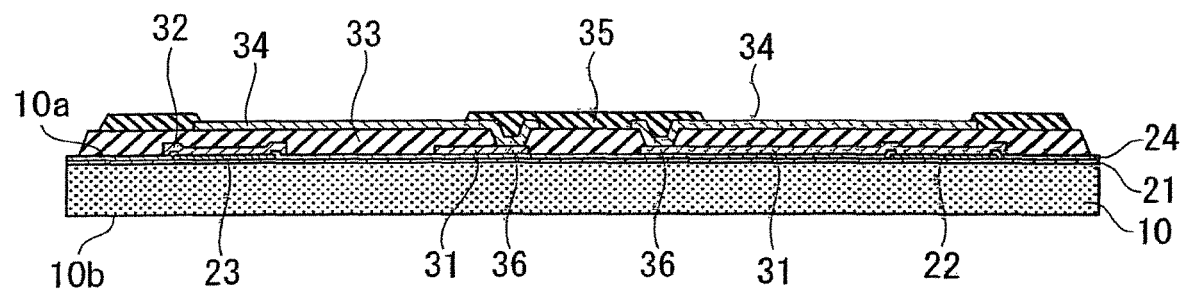
FIGS. 4A to 4C are cross-sectional views of a manufacturing method for semiconductor device according to an embodiment of this invention.

Firstly, as shown in FIG. 4A, the foundation layer 21 is formed on the first face 10a of the silicon substrate 10.

The first electrode 22 and the second electrode 23 are then formed on the foundation layer 21.

The first insulating layer 24 is then formed on the first electrode 22 and the second electrode 23, and insulating material covering the first electrode 22 and the second electrode 23 is removed by a conventional method such as photolithography or etching.

It is not absolutely necessary to remove the insulating material which covers the second electrode 23.

Next, the first interconnection 31 is formed on the first insulating layer 24 including the first electrode 22, and the metal film 32 is formed on the top face of the second electrode 23.

The first interconnection 31 is formed by sequentially sputtering, for example, TiW and Cu, and then plating the Cu.

The second insulating layer 33 is formed so as to cover the first interconnection 31 and the metal film 32.

The region corresponding to the land section 36 of the second insulating layer 33 is removed by a conventional photolithography method.

A part of the first interconnection 31 is thereby exposed, the land section 36 is formed.

The second interconnection 34 is formed on the second insulating layer 33 so as to connect to the land section 36.

The third insulating layer 35 is then formed so as to cover the second insulating layer 33 and the second interconnection 34, excepting the region on which the bump 37 is formed on the second insulating layer 33 and the second interconnection 34.

Figure 4B:
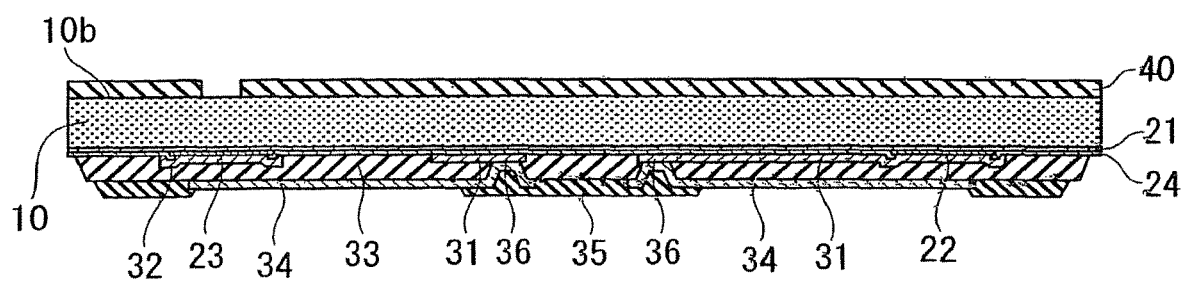

As shown in FIG. 4B, the sections of the silicon substrate 10 and the foundation layer 21 that correspond to the second electrode 23, are removed by dry etching of the second face 10b of the silicon substrate 10 using a photoresist 40 as a mask.

Figure 4C:
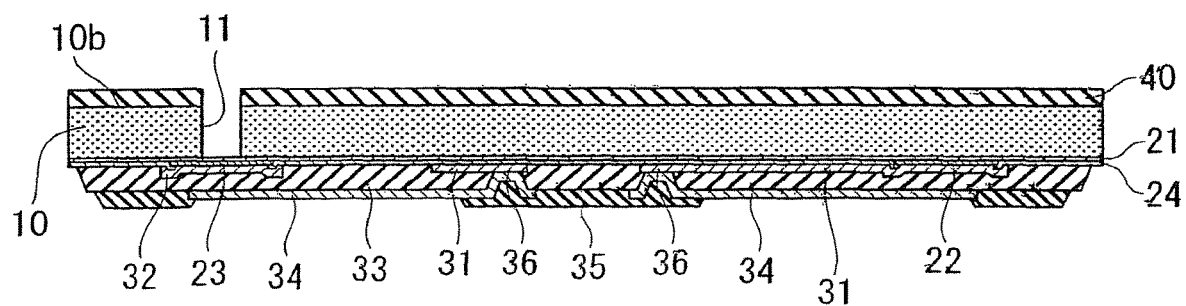

As shown in FIG. 4C, the groove portion 11 is formed by etching from the second face 10b of the silicon substrate 10 to the rear face 23a of the second electrode 23 formed on the first face 10a.

In this embodiment, the photoresist 40 is used as a mask, there is no limitation on this, for example an $SiO_2$ film may be used as a hard mark, or a photoresist and a hard mask may be used together.

The etching method is not limited to dry etching, it being acceptable to use wet etching, laser processing, or both of these.

Figure 5A:
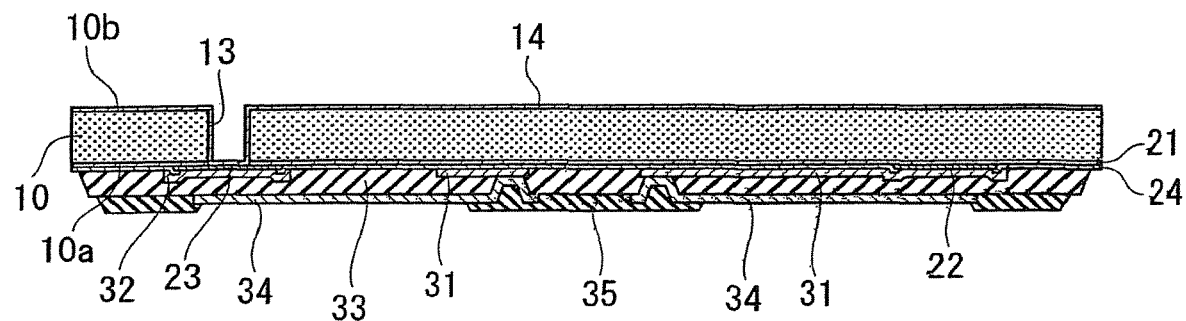
FIGS. 5A to 5C are cross-sectional views of a manufacturing method for semiconductor device according to an embodiment of this invention.

Subsequently, as shown in FIG. 5A, the rear face insulating layer 14 and the insulating film 13 are formed on the second face 10b of the silicon substrate 10 and the inner walls of the groove portion 11.

The rear face insulating layer 14 and the insulating film 13 prevent generation of current leakage, corrosion of the silicon substrate 10 due to oxygen and water, and the similar.

As materials of the rear face insulating layer 14 and of the insulating film 13, tetraethyl orthosilicate ($Si(OC_2H_5)_4$: hereinafter TEOS) formed by using plasma-enhanced chemical vapor deposition (PECVD), namely PE-TEOS, and TEOS formed by using ozone CVD, namely $O_3$-TEOS, and silicon dioxide ($SiO_2$) formed by using CVD, can be used.

Other insulating materials may be used for the rear face insulating layer 14 and the insulating film 13, even resin.

Figure 5B:
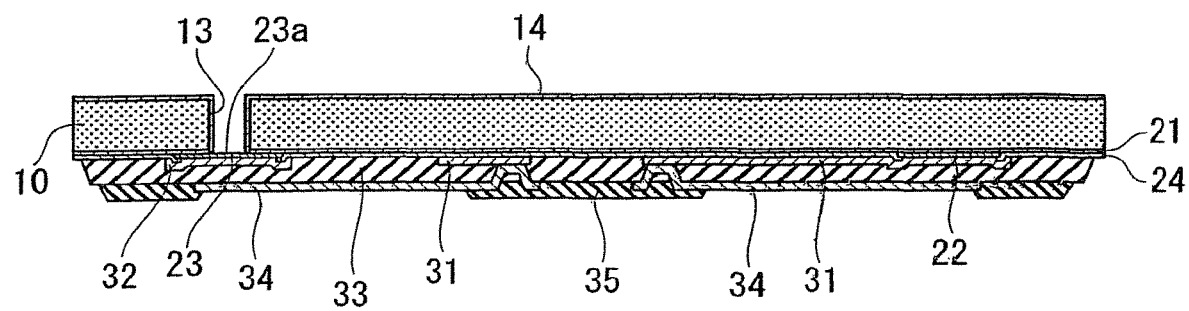

The insulating film 13 formed on the rear face 23a of the second electrode 23 is removed by dry etching or laser processing to expose the rear face 23a of the second electrode 23 as shown in FIG. 5B.

The insulating film 13 remains on the side walls of the groove portion 11.

The inside of the groove portion 11 is plated using an electrochemical plating (ECP) method, a conductive material for forming the conductive portion 12 is deposited on the inner sides of the groove portion 11, and the first end 12a of the conductive portion 12 is electrically connected to the exposed second electrode 23 on the rear face 23a of the second electrode 23.

Copper (Cu), for example, is used as the conductive material for forming the conductive portion 12.

Therefore, copper (Cu) is buried in the groove portion 11.

In this embodiment, the process of forming the conductive portion 12 includes, for example, a process of sputtering (laminating) TiN and Cu, and a process of plating the Cu.

Alternatively, a process of sputtering (laminating) TiW and Cu, and a process of plating the Cu, may be included.

The method for forming the conductive portion 12 is not limited to that mentioned above, a conductive paste, a molten metal, a metal wire, and the similar may be buried.

The conductive portion 12 is buried inside the groove portion 11 in this embodiment.

Instead of completely burying the conductive portion 12, the conductive portion 12 may be formed on the inner walls of the groove portion 11 and be electrically connected to the rear face 23a of the second electrode 23.

Figure 5C:
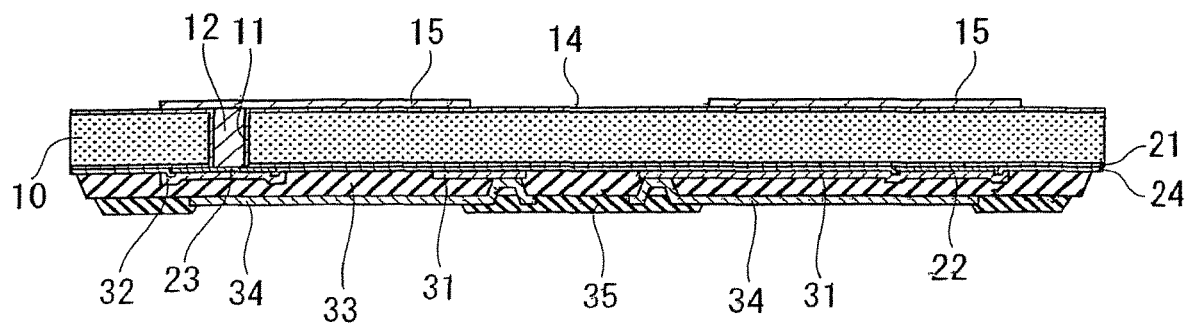

As shown in FIG. 5C, after forming the conductive portion 12, the rear face electrode 15 which electrically connected to the conductive portion 12, is formed on the second face 10b of the silicon substrate 10.

When forming the rear face electrode 15, simultaneously with the conductive portion 12 may be formed.

That is, the rear face electrode 15 and the conductive portion 12 may be formed in one operation.

The bump 37 includes a lead-free solder for example, and is formed on the second interconnection 34 on the first face 10a of the silicon substrate 10.

When forming the bump 37, a soldering ball may be packaged on the second interconnection 34 or a soldering paste may be printed onto the second interconnection 34.

By these processes, a plurality of semiconductor devices 1 can be simultaneously formed together on one silicon substrate 100.

Figure 6:
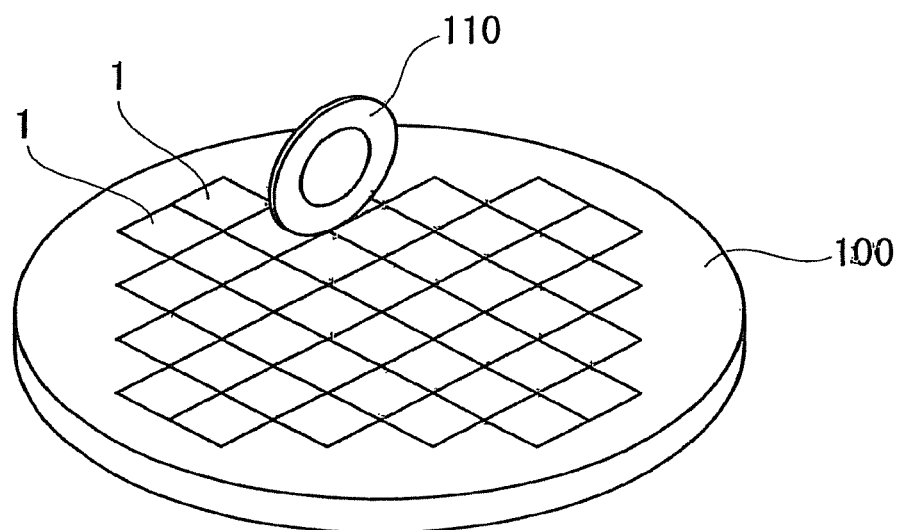
FIG. 6 is a cross-sectional view of a manufacturing method for semiconductor device according to an embodiment of this invention.

As shown in FIG. 6, a dicing device divides each of the semiconductor devices 1 by cutting (dicing) the silicon substrate 100.

By forming the plurality of semiconductor devices 1 almost simultaneously on the silicon substrate 100 and dicing the silicon substrate 100 into the individual semiconductor devices 1, a plurality of the semiconductor device 1 as shown in FIG. 1 can be obtained.

In this manner, the semiconductor device 1 can be manufactured efficiently and its manufacturing cost can be reduced.

According to the semiconductor device 1 of this embodiment, by forming the conductive portion 12 inside the groove portion 11 as far as the second electrode 23, the second electrode 23 and the electronic element can be electrically connected via the conductive portion 12.

Since the first electrode 22 and the bump 37 are electrically connected, it is possible to make the semiconductor device 1, which can be connected to external devices and the similar, small and thinner, and increase its performance.

First Embodiment of Electronic Component

Subsequently, a first embodiment of an electronic component 50, in which an electronic element including a SAW element 60 (electronic element) is packaged on the semiconductor device 1, will be explained with reference to FIG. 7.

In each of the embodiments described below, parts which are identical with the configuration of the semiconductor device 1 according to the embodiment described above are represented by identical reference numerals and are not repetitiously explained.

A semiconductor device 51 used in the electronic component 50 of this embodiment has the same configuration as the semiconductor device 1 described above, excepting that the rear face electrode 15 is not provided.

Figure 8:
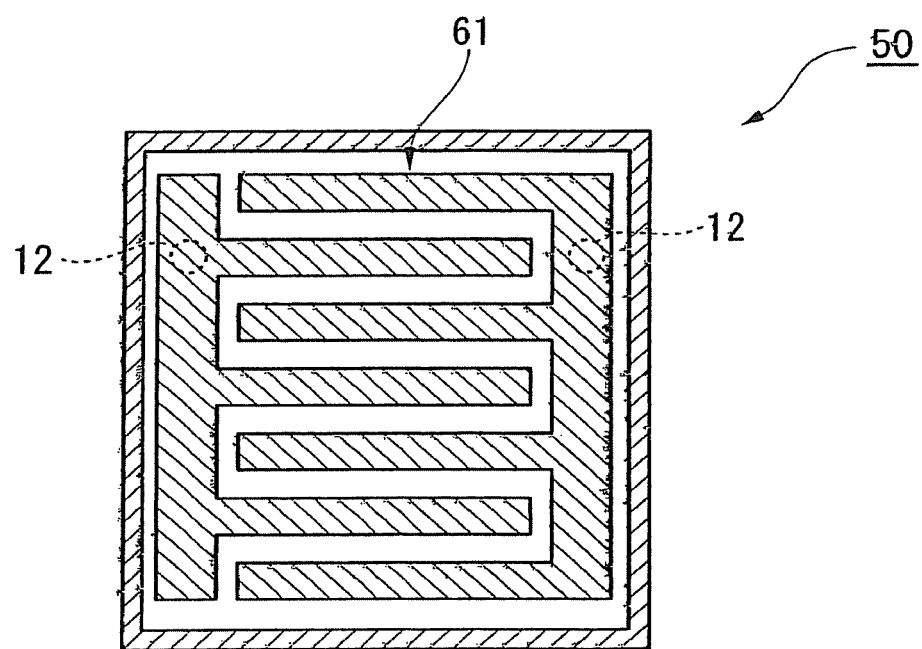
FIG. 8 is a plan view of an electrode of the electronic component of FIG. 7.

As shown in FIG. 8, the electronic component 50 includes a piezoelectric film and a fork-type electrode 61 which touches the piezoelectric film.

Figure 7:
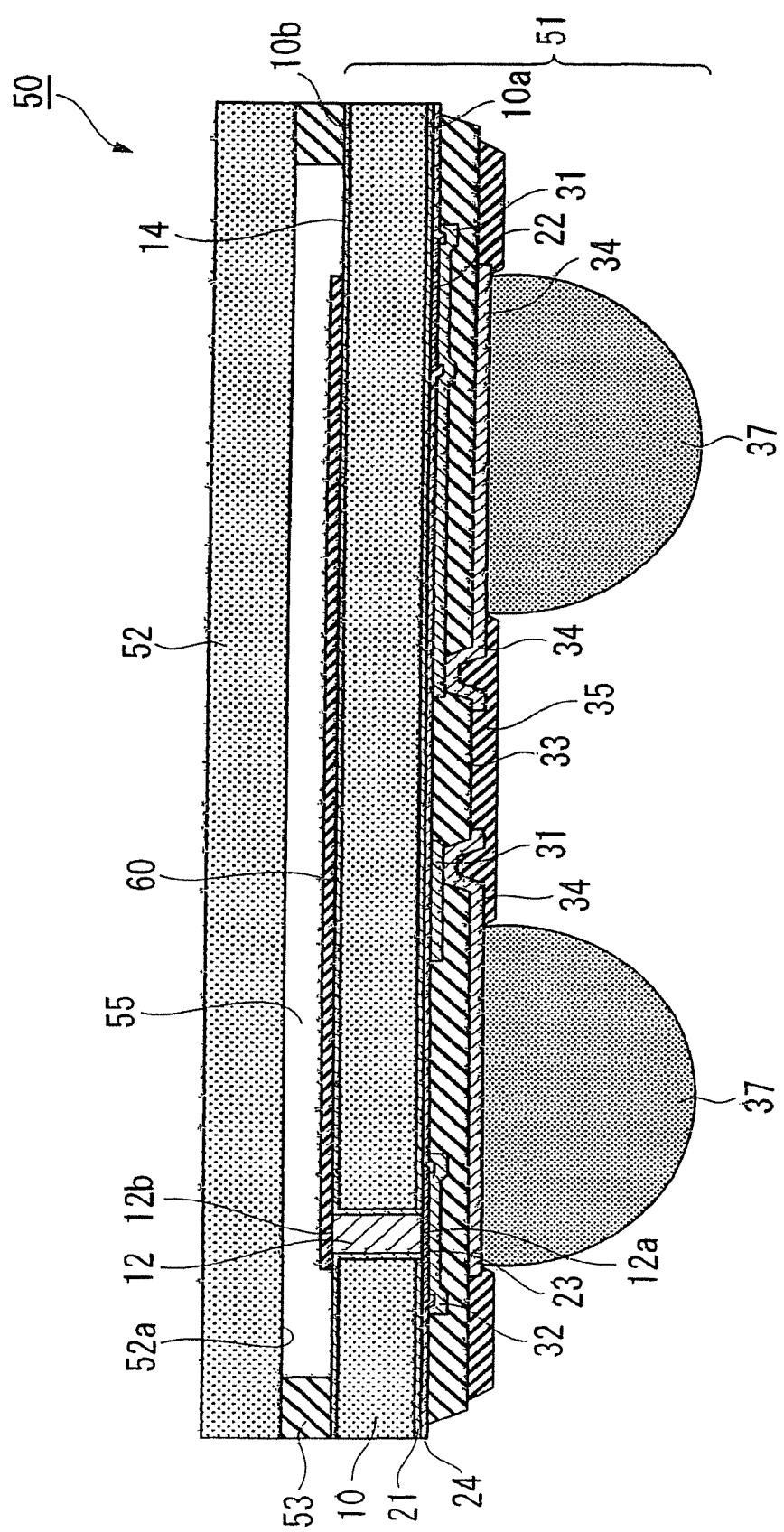
FIG. 7 is a cross-sectional view of an electronic component according to an embodiment of this invention.

As shown in FIG. 7, the electronic component 50 is formed on the second face 10b of the silicon substrate 10.

The SAW element 60 is electrically connected to the second end 12b of the conductive portion 12, and is formed directly on the second face 10b.

An integrated circuit including a transistor and a memory element, for example, is formed on the first face 10a of the silicon substrate 10.

The first end 12a of the conductive portion 12 is electrically connected to this integrated circuit via the second electrode 23.

Therefore, the SAW element 60 formed on the second face 10b of the silicon substrate 10 is electrically connected via the conductive portion 12 to the integrated circuit formed on the first face 10a of the silicon substrate 10.

The electronic component 50 includes a sealing member 52.

By arranging the SAW element 60 between the sealing member 52 and the second face 10b of the silicon substrate 10, the SAW element 60 is sealed.

While in this embodiment the sealing member 52 is made of a glass substrate, a silicon substrate may be used.

The sealing member 52 is spaced from the second face 10b of the silicon substrate 10.

The peripheral edge of the second face 10b of the silicon substrate 10 is affixed to the peripheral edge of an inner face 52a of the sealing member 52 by an adhesive layer 53.

For example, a synthetic resin such as polyimide resin can be used as the material of the adhesive layer 53.

An internal space 55 enclosed by the second face 10b of the silicon substrate 10, the inner face 52a of the sealing member 52, and the adhesive layer 53 is substantially sealed (by an airtight seal), and the SAW element 60 is arranged in the internal space 55.

Manufacturing Method for Electronic Component

Subsequently, a method for manufacturing the electronic component 50 will be explained.

By performing a process similar to the method for manufacturing the semiconductor device 1 described above, the conductive portion 12 is formed, and the SAW element 60 is then formed on the second face 10b of the silicon substrate 10.

The process of forming this SAW element 60 includes a process of forming a piezoelectric film, a process of forming a fork-type electrode 61 touching the piezoelectric film such as shown in FIG. 8, and a process of forming a protective film.

In addition, the process of forming the SAW element 60 includes a process of irradiating plasma or the similar onto the SAW element 60 and adjusting the frequency.

As examples of materials used for the piezoelectric film, zinc oxide (ZnO), aluminum nitride (AlN), lithium niobate ($LiNbO_3$), lithium tantalate ($LiTaO_3$), and potassium niobate ($KNbO_3$) can be used.

As a material of the fork-type electrode 61, a metal including aluminum can be used.

As the material of the protective film, Silicon dioxide ($SiO_2$), silicon nitride ($Si_3N_4$), titanium nitride (TiN), and the similar, may be used.

The SAW element 60 thus formed is electrically connected to the second end 12b of the conductive portion 12 on the second face 10b of the silicon substrate 10.

An adhesive for forming the adhesive layer 53 is provided on at least one of the second face 10b of the silicon substrate 10 and the inner face 52a of the sealing member 52.

A photosensitive polyimide adhesive or the similar can be used as the adhesive layer 53.

The silicon substrate 10 and the sealing member 52 are connected together with the second face 10b of the silicon substrate 10 and the inner face 52a of the sealing member 52 facing each other on opposite sides of this adhesive layer 53.

This obtains the electronic component 50 as shown in FIG. 7.

The structure for sealing the SAW element 60 may be a vacuum seal achieved by making the internal space 55 a vacuum, a gas replacement seal achieved by replacing the atmosphere of the internal space 55 with a predetermined gas such as $N_2$, Ar, and He, and the similar.

When connecting the silicon substrate 10 and the sealing member 52, metal protrusions may be formed along the peripheral edge of the second face 10b of the silicon substrate 10, and a metal layer for affixing the metal protrusions may be formed on the inner face 52a of the sealing member 52, the silicon substrate 10 and the sealing member 52 may be connected together via these metal protrusions and the metal layer.

When a permeable glass is used as the sealing member 52, after the sealing process, the frequency of the SAW element 60 can be adjusted by transmitting a laser or the similar through the glass.

The bump made of a lead-free solder for example, is then packaged on the second interconnection 34 formed on the first face 10a of the silicon substrate 10.

When forming the bump 37, a soldering ball may be packaged on the second interconnection 34 or a soldering paste may be printed onto the second interconnection 34.

In the manufacturing method of this electronic component 50, in the same manner as the manufacturing method of the semiconductor device 1, the electronic component 50, the SAW element 60, the sealing member 52, and so on, are simultaneously formed together on the same silicon substrate (semiconductor substrate).

The electronic component 50 is obtained by dividing individual electronic components 50 by using a dicing device 110 as in the manufacturing method of the semiconductor device 1.

This enables the electronic component 50 to be manufactured inexpensively.

The manufactured electronic component 50 is packaged via the bump 37 on a printed wiring board P or the similar.

In the electronic component 50 according to this embodiment, the SAW element 60 is formed on the second face 10b of the silicon substrate 10 and the second end 12b of the conductive portion 12 is connected to this SAW element 60.

In this case, by providing an integrated circuit for driving and for controlling the SAW element 60 on the first face 10a of the silicon substrate 10, the SAW element 60 can be electrically connected to the integrated circuit via the conductive portion 12.

Therefore, the overall electronic component 50 can be made smaller and thinner while reliably sealing and driving the SAW element 60.

In addition, since SAW element 60 is sealed between the sealing member 52 and the second face 10b, it is possible to realize smaller and thinner, to seal the SAW element 60, and to drive the SAW element 60.

Second Embodiment of Electronic Component

Subsequently, a second embodiment of an electronic component 70, in which an electronic element including a SAW element 71 is packaged on the semiconductor device 1 described above will be explained with reference to FIG. 9.

In each of the embodiments described below, parts which are identical with the configuration of the semiconductor device 1 according to the above mentioned first embodiment are represented by identical reference numerals and are not repetitiously explained.

The electronic component 70 of this embodiment differs from that of the first embodiment in that, instead of forming the SAW element 71 on the second face 10b of the silicon substrate 10, the SAW element 71 is formed on the sealing member 52 which is spaced and is arranged separately from the second face 10b of the silicon substrate 10.

The SAW element 71 is formed on the inner face 52a (facing face) of the sealing member 52.

The inner face 52a is faced to the second face 10b of the silicon substrate 10.

The SAW element 71 includes a terminal 72 facing the second face 10b of the silicon substrate 10.

In a semiconductor device 73, a rear face electrode 54 (connection electrode) is formed above the groove portion 11 in the second face 10b of the silicon substrate 10.

The rear face electrode 54 is electrically connected to the second end 12b of the conductive portion 12.

The rear face electrode 54 is formed at a position corresponding to the terminal 72 of the SAW element 71.

That is, the second electrode 23 is electrically connected to the SAW element 71 formed on the inner face (facing face) 52a of the sealing member 52 via the conductive portion 12 and the rear face electrode 54.

The sealing member 52 is, for example, a silicon substrate, a crystal substrate, and a substrate including silicon and diamond.

A method for manufacturing the electronic component 70 will be explained.

Firstly, the SAW element 71 is formed beforehand on the inner face 52a of the sealing member 52.

The rear face electrode 54 is formed on the second face 10b of the silicon substrate 10.

The terminal 72 is also formed.

The silicon substrate 10 and the sealing member 52 are then connected via the adhesive layer 53 such that the rear face electrode 54 is electrically connected to the terminal 72.

Figure 9:
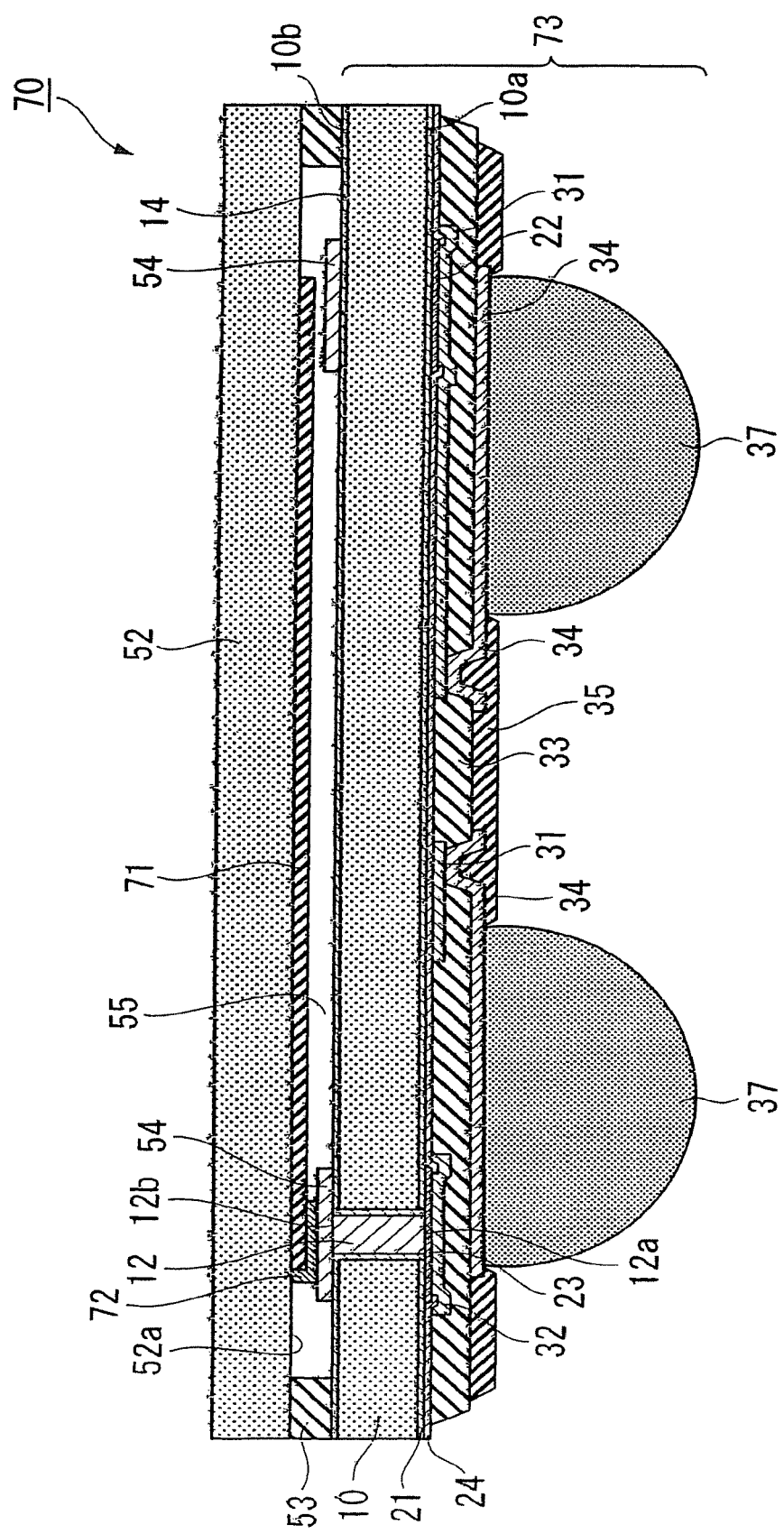
FIG. 9 is a cross-sectional view of an electronic component according to a second embodiment of this invention.

This obtains the electronic component 70 as shown in FIG. 9.

In the process of connecting the rear face electrode 54 to the terminal 72, they may be pressed together by compressing the adhesive layer 53.

According to the electronic component 70 of this embodiment, since the SAW element 71 is formed on the sealing member 52 as a separate member from the silicon substrate 10, the SAW element 71 is less liable to be affected by thermal stress and film stress applied to the silicon substrate 10, obtaining superior characteristics.

Third Embodiment of Electronic Component

Figure 10:
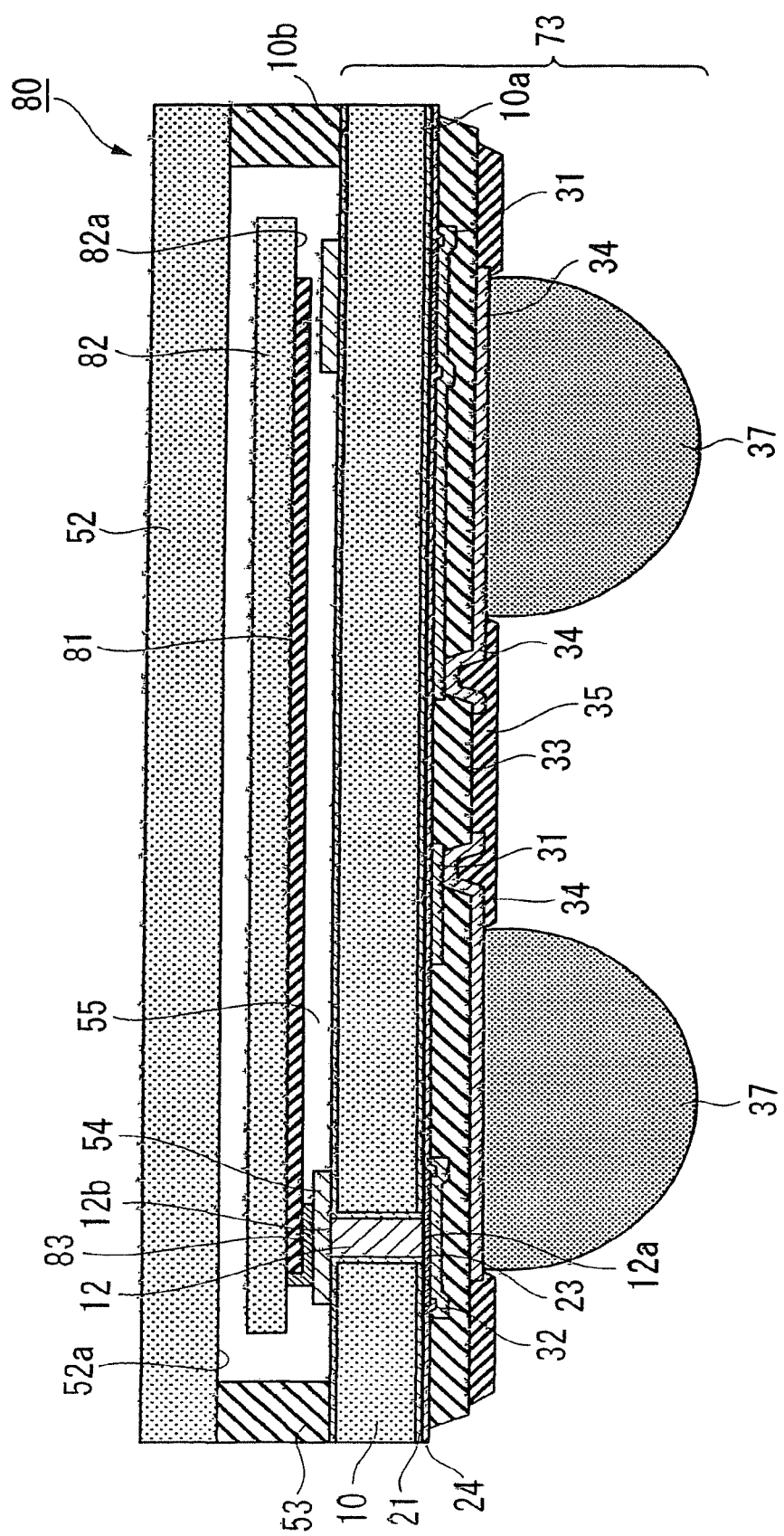
FIG. 10 is a cross-sectional view of an electronic component according to a third embodiment of this invention.

Subsequently, a third embodiment of an electronic component 80, in which an electronic element including a SAW element 81 is packaged on the semiconductor device 1 described above will be explained with reference to FIG. 10.

The electronic component 80 according to this embodiment differs from the second embodiment in that, instead of forming the SAW element 81 on the second face 10b of the silicon substrate 10, the SAW element 81 is formed on a supporting substrate 82.

The supporting substrate 82 is arranged between the second face 10b of the silicon substrate 10 and the sealing member 52 which is spaced from the second face 10b of the silicon substrate 10.

The SAW element 81 is formed on a face 82a of the supporting substrate 82 facing the second face 10b of the silicon substrate 10.

Moreover, a terminal 83 is formed on the SAW element 81 and faces the second face 10b of the silicon substrate 10 in the same manner as the electronic component 70 of the second embodiment.

This terminal 83 is electrically connected to the rear face electrode 54.

According to the electronic component 80 of this embodiment, since the SAW element 81 is formed on the supporting substrate 82 which is a separate member from the silicon substrate 10, the SAW element 81 is less liable to be affected by thermal stress and film stress applied to the silicon substrate 10, obtaining superior characteristics.

The supporting substrate 82 reliably supports the SAW element 81, it is possible to electrically connect the SAW element 81 to the conductive portion 12.

Fourth Embodiment of Electronic Component

Figure 11:
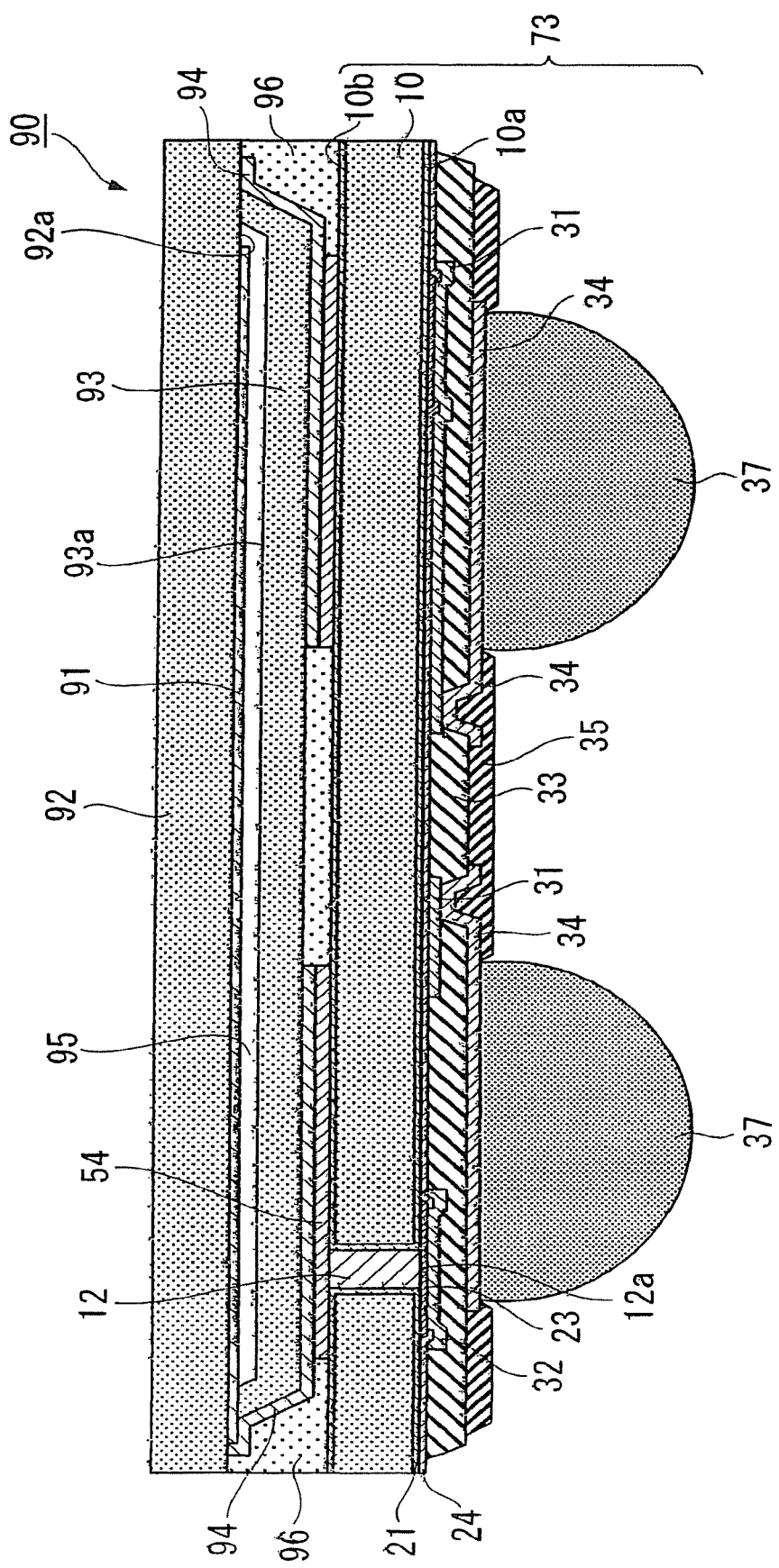
FIG. 11 is a cross-sectional view of an electronic component according to a fourth embodiment of this invention.

Subsequently, a fourth embodiment of an electronic component 90, in which an electronic element including an AT oscillator (liquid crystal oscillator) 91 is packaged on the semiconductor device 1 will be explained with reference to FIG. 11.

The electronic component 90 of this embodiment differs from that of the second embodiment in that the AT oscillator 91 is sealed by a sealing member 93 while being supported by a supporting substrate 92.

The supporting substrate 92 is spaced and is arranged separately from the second face 10b of the silicon substrate 10.

The AT oscillator 91 is formed on an inner face 92a of the supporting substrate 92 facing the second face 10b of the silicon substrate 10.

The AT oscillator 91 is sealed by the sealing member 93 made of a glass substrate which is provided between the supporting substrate 92 and the second face 10b of the silicon substrate 10.

An internal space 95 is enclosed by the inner face 92 of the supporting substrate 92 and an inner face 93a of the sealing member 93, and sealed in an substantially airtight seal.

An electronic element electrode 94 is provided on a face of the sealing member 93 which faces the second face 10b of the silicon substrate 10.

The electronic element electrode 94 covers the sealing member 93.

The electronic element electrode 94 and the rear face electrode 54 are electrically connected.

That is, the second electrode 23 is electrically connected to the AT oscillator 91 via the conductive portion 12 formed on the silicon substrate 10 and the rear face electrode 54 formed on the second face 10b of the silicon substrate 10.

The peripheral edge of the second face 10b of the silicon substrate 10 and the peripheral edge of the supporting substrate 92 are sealed with a sealing resin 96.

The space between the second face 10b and the sealing member 93 is sealed by the sealing resin 96.

According to the electronic component 90 of this embodiment, since the AT oscillator is supported by the supporting substrate 92 and sealed by the sealing member 93, the electronic element electrode 94 formed on the sealing member 93 can be electrically connected to the conductive portion 12.

This enables the electronic element to be made smaller and thinner, and drive reliably.

Electronic Apparatus

Figure 12:
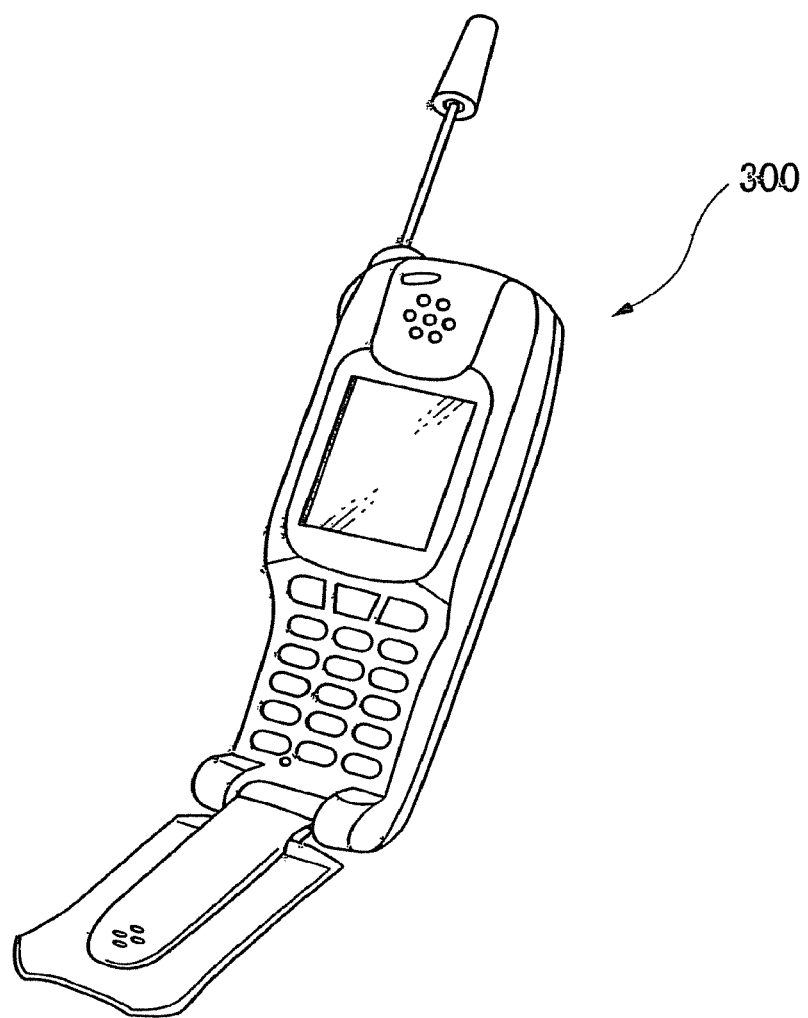
FIG. 12 is a view of an electronic apparatus in which an electronic component of this invention is packaged.

FIG. 12 is one example of an electronic apparatus including any one of the above mentioned electronic components 50, 70, 80, and 90, is a view of a mobile telephone 300.

By packaging the electronic components of this invention, which are made smaller and thinner while increasing their performance, the mobile telephone 300 can be miniaturized.

The embodiments of the invention described above are not limited, it is possible to make various modifications without departing from the spirit or scope of the invention.

For example, while the embodiment of the semiconductor device 1 described above includes the rear face electrode 15, the electrode of the electronic component may be connected directly to the second end 12b of the conductive portion 12.

To facilitate the metal connections, the top faces of the rear face electrodes 15 and 54 connected to the SAW elements 60, 71 and 81 and the AT oscillator 91, or the top face of the second end 12b of the conductive portion 12, may be processed with metal or plated with a brazing filler metal (e.g., SnAg plating).

In each of the above embodiments, in addition to the final process of dicing, the individual electronic components may be obtained by other appropriate processes (intermediate steps).

Moreover, when glass substrates are used as the sealing members 52 and 93, while the sealing members 52 and 93 consisting of these glass substrates can be diced (cut) by the dicing device 110 described in FIG. 6, they can also be diced by laser irradiation, or by another dicing method using dry etching or wet etching.

While SAW elements are described as electronic elements of this invention in the first embodiment, the second embodiment, and the third embodiment, this is not limitative of the invention, and any element which requires a sealed structure can be used, e.g., crystal oscillators, piezoelectric oscillators, and piezoelectric tuning-forks.

While the fourth embodiment describes an AT oscillator (liquid crystal oscillator), this is not limitative of the invention, and any element which requires a sealed structure can be used, e.g., a SAW element, a piezoelectric oscillator, and a piezoelectric tuning-fork.

If necessary, the silicon substrate 10 may be thinned after forming the interconnection section 30 on it.

A method for thinning the silicon substrate 10 will be explained.

Firstly, an unillustrated glass plate is affixed to the first face 10a side of the silicon substrate 10 using an adhesive which can be peeled away by irradiation of ultraviolet light (UV light).

This glass plate is part of what is termed a wafer support system (WSS), and, after supporting the silicon substrate 10 on the glass plate, the second face 10b of the silicon substrate 10 is processed by polishing, dry or wet etching, and so on, with the glass plate still affixed to it.

This enables the silicon substrate 10 to be made thin.

What is claimed is:

1. A device comprising:
   a semiconductor substrate including a first face and a second face on a side opposite to the first face;
   a foundation layer formed on the first face of the semiconductor substrate;
   a first electrode formed on the foundation layer;
   a second electrode formed on the foundation layer;
   an integrated circuit comprising at least two interconnected semiconductor devices, the at least two interconnected semiconductor devices formed on the first face of the semiconductor substrate, and the integrated circuit being electrically connected to the first electrode and the second electrode;
   a groove portion formed through the semiconductor substrate;
   an insulating film formed on a side wall of the groove portion;
   a conductive portion formed inside the groove portion on the insulating film and electrically connected to the second electrode;
   a first insulation layer formed on the foundation layer;
   a first interconnection formed on the first insulation layer, the first interconnection being electrically connected to the first electrode;
   a second insulation layer formed on the first interconnection and the first insulation layer;
   a second interconnection formed on the second insulation layer, the second interconnection being electrically connected to the first interconnection; and
   a third insulation layer formed on the second interconnection and the second insulation layer;
   wherein the semiconductor substrate is silicon;
   wherein the integrated circuit is configured to apply a voltage to the second electrode; and
   wherein the second interconnection, the first interconnection, the first electrode, the integrated circuit, the second electrode and the conductive portion are electrically connected in that order.

2. The device of claim 1, further comprising:
   a rear face insulating layer formed on the second face of the semiconductor substrate;
   a rear face electrode formed on the rear face insulating layer, the rear face electrode electrically connected to the conductive portion; and
   wherein the second interconnection, the first interconnection, the first electrode, the integrated circuit, the second electrode, the conductive portion and the rear face electrode are electrically connected in that order.

3. The device of claim 2, wherein the conductive portion extends from the rear face electrode to the second electrode.

4. The device of claim 2, wherein the conductive portion and the rear face electrode are integrally formed.

5. The device of claim 3, wherein the conductive portion and the rear face electrode are integrally formed.

6. The device of claim 2, further comprising:
   an external connection terminal formed on the first face of the semiconductor substrate, the external connection terminal electrically connected to the second interconnection;
   wherein the external connection terminal, the second interconnection, the first interconnection, the first electrode, the integrated circuit, the second electrode, the conductive portion and the rear face electrode are electrically connected in that order.

7. The device of claim 6, wherein the third insulation layer is not formed over a landing portion of the second interconnection, and wherein the external connection terminal is formed on the landing portion.

8. The device of claim 6,
   wherein the second electrode comprises a second electrode rear face facing the first face of the semiconductor substrate and a second electrode top face on a side opposite the second electrode rear face;

wherein the external connection terminal, the second interconnection, the first interconnection, the first electrode, the integrated circuit, the second electrode top face, the second electrode rear face, the conductive portion and the rear face electrode are electrically connected in that order;
wherein the second electrode overlaps with the conductive portion in plan view; and
wherein the conductive portion is displaced from the external connection terminal in plan view.

9. The device of claim 8, wherein the second electrode is displaced from the first electrode in plan view and wherein the first electrode is displaced from the external connection terminal in plan view.

10. The device of claim 2,
wherein the second electrode comprises a second electrode rear face facing the first face of the semiconductor substrate and a second electrode top face on a side opposite the second electrode rear face;
wherein the second interconnection, the first interconnection, the first electrode, the integrated circuit, the second electrode top face, the second electrode rear face, the conductive portion and the rear face electrode are electrically connected in that order;
wherein the second electrode is displaced from the first electrode in plan view; and
wherein the conductive portion is displaced from the first electrode in plan view.

11. The device of claim 2, wherein the first insulation layer is further formed on the first electrode and the second electrode.

12. A device comprising:
a semiconductor substrate including a first face and a second face on a side opposite to the first face;
a foundation layer formed on the first face of the semiconductor substrate;
a first electrode formed on the foundation layer;
a second electrode formed on the foundation layer;
an integrated circuit comprising at least two interconnected semiconductor devices, the at least two interconnected semiconductor devices formed on the first face of the semiconductor substrate, and the integrated circuit being electrically connected to the first electrode and the second electrode;
a groove portion formed through the semiconductor substrate;
an insulating film formed on a side wall of the groove portion;
a conductive portion formed inside the groove portion on the insulating film and electrically connected to the second electrode;
a first insulation layer formed on the foundation layer;
a first interconnection formed on the first insulation layer, the first interconnection being electrically connected to the first electrode;
a second insulation layer formed on the first interconnection and the first insulation layer;
a second interconnection formed on the second insulation layer, the second interconnection being electrically connected to the first interconnection;
a third insulation layer formed on the second interconnection and the second insulation layer;
a second semiconductor substrate including a second semiconductor substrate first face and a second semiconductor substrate second face on a side opposite to the second semiconductor substrate first face; and
an electronic element formed on the second semiconductor substrate first face, the electronic element being electrically connected to the conductive portion;
wherein the semiconductor substrate is silicon;
wherein the second semiconductor substrate is silicon;
wherein the integrated circuit is configured to apply a voltage to the electronic element via the second electrode and the conductive portion; and
wherein the second interconnection, the first interconnection, the first electrode, the integrated circuit, the second electrode the conductive portion and the electronic element are electrically connected in that order.

13. The device of claim 12, wherein the integrated circuit is configured to drive the electronic element.

14. The device of claim 12, wherein the integrated circuit is configured to control the electronic element.

15. The device of claim 12, wherein the integrated circuit comprises a memory element.

16. The device of claim 12, further comprising:
a circuit substrate;
wherein the circuit substrate is electrically connected to the second interconnection; and
wherein the circuit substrate, the second interconnection, the first interconnection, the first electrode, the integrated circuit, the second electrode, the conductive portion and the electronic element are electrically connected in that order.

17. The device of claim 16, wherein the circuit substrate is a printed wiring board.

18. The device of claim 16, wherein the circuit substrate is an external apparatus.

19. The device of claim 12, further comprising:
a rear face insulating layer formed on the second face of the semiconductor substrate;
a rear face electrode formed on the rear face insulating layer, the rear face electrode electrically connected to the conductive portion and the electronic element; and
wherein the second interconnection, the first interconnection, the first electrode, the integrated circuit, the second electrode, the conductive portion, the rear face electrode and the electronic element are electrically connected in that order.

20. The device of claim 19, wherein the conductive portion extends from the rear face electrode to the second electrode.

21. The device of claim 19, further comprising:
an external connection terminal formed on the first face of the semiconductor substrate, the external connection terminal electrically connected to the second interconnection;
wherein the external connection terminal, the second interconnection, the first interconnection, the first electrode, the integrated circuit, the second electrode, the conductive portion, the rear face electrode and the electronic element are electrically connected in that order.

22. The device of claim 21, wherein the third insulation layer is not formed over a landing portion of the second interconnection, and wherein the external connection terminal is formed on the landing portion.

23. The device of claim 21,
wherein the second electrode comprises a second electrode rear face facing the first face of the semiconductor substrate and a second electrode top face on a side opposite the second electrode rear face;
wherein the external connection terminal, the second interconnection, the first interconnection, the first electrode, the integrated circuit, the second electrode top face, the second electrode rear face, the conductive portion, the rear face electrode and the electronic element are electrically connected in that order;

wherein the second electrode overlaps with the conductive portion in plan view; and wherein the conductive portion is displaced from the external connection terminal in plan view.

24. The device of claim 23, wherein the second semiconductor substrate first face is facing the second face of the semiconductor substrate.

25. The device of claim 21, wherein the second semiconductor substrate first face is facing the second face of the semiconductor substrate.

26. The device of claim 19, wherein the second electrode comprises a second electrode rear face facing the first face of the semiconductor substrate and a second electrode top face on a side opposite the second electrode rear face;

wherein the second interconnection, the first interconnection, the first electrode, the integrated circuit, the second electrode top face, the second electrode rear face, the conductive portion, the rear face electrode and the electronic element are electrically connected in that order;

wherein the second electrode is displaced from the first electrode in plan view; and wherein the conductive portion is displaced from the first electrode in plan view.

27. A device comprising:

a semiconductor substrate including a first face and a second face on a side opposite to the first face;

a foundation layer formed on the first face of the semiconductor substrate;

a first electrode formed on the foundation layer;

a second electrode formed on the foundation layer;

an integrated circuit comprising at least two interconnected semiconductor devices, the at least two interconnected semiconductor devices formed on the first face of the semiconductor substrate, and the integrated circuit being electrically connected to the first electrode and the second electrode;

a groove portion etched through the semiconductor substrate;

an insulating film formed on a side wall of the groove portion;

a conductive portion formed inside the groove portion on the insulating film and electrically connected to the second electrode;

a first insulation layer formed on the foundation layer, the first electrode and the second electrode;

a first interconnection formed on the first insulation layer, the first interconnection being electrically connected to the first electrode;

a second insulation layer formed on the first interconnection and the first insulation layer;

a second interconnection formed on the second insulation layer, the second interconnection being electrically connected to the first interconnection; and a third insulation layer formed on the second interconnection and the second insulation layer;

wherein the semiconductor substrate is silicon; and wherein the second interconnection, the first interconnection, the first electrode, the integrated circuit, the second electrode and the conductive portion are electrically connected in that order.

28. The device of claim 27, further comprising:

a rear face insulating layer formed on the second face of the semiconductor substrate;

a rear face electrode formed on the rear face insulating layer; the rear face electrode electrically connected to the conductive portion; and wherein the second interconnection, the first interconnection, the first electrode, the integrated circuit, the second electrode, the conductive portion and the rear face electrode are electrically connected in that order.

29. The device of claim 28, wherein the conductive portion extends from the rear face electrode to the second electrode.

30. The device of claim 29, wherein the conductive portion and the rear face electrode are integrally formed.

* * * * *